(12) United States Patent
Rajendran et al.

(10) Patent No.: US 11,800,674 B2
(45) Date of Patent: Oct. 24, 2023

(54) EXPANDABLE HOUSING FOR A COMPUTING SYSTEM

(71) Applicant: Hewlett Packard Enterprise Development LP, Houston, TX (US)

(72) Inventors: Ranjith Babu Rajendran, Bangalore Karnataka (IN); Balachander Ramamoorthy, Bangalore Karnataka (IN); Senthil Velan Arumugam, Bangalore Karnataka (IN)

(73) Assignee: Hewlett Packard Enterprise Development LP, Spring, TX (US)

(*) Notice: Subject to any disclaimer, the term of this patent is extended or adjusted under 35 U.S.C. 154(b) by 0 days.

(21) Appl. No.: 17/249,447

(22) Filed: Mar. 2, 2021

(65) Prior Publication Data

US 2022/0287198 A1    Sep. 8, 2022

(51) Int. Cl.
*H05K 7/14*    (2006.01)
*H05K 7/18*    (2006.01)

(52) U.S. Cl.
CPC ........... *H05K 7/1489* (2013.01); *H05K 7/183* (2013.01)

(58) Field of Classification Search
CPC ....................................................... G06F 1/16
See application file for complete search history.

(56) References Cited

U.S. PATENT DOCUMENTS

| 8,867,214 | B2 | 10/2014 | Ross et al. | |
| 9,958,911 | B2 | 5/2018 | Alvarado et al. | |
| 10,219,400 | B2 | 2/2019 | Klaba et al. | |
| 2004/0080244 | A1 | 4/2004 | Lowther et al. | |
| 2013/0208420 | A1* | 8/2013 | Franklin | H05K 7/1488 211/183 |

FOREIGN PATENT DOCUMENTS

WO    WO-2014127248 A1 *    8/2014    ............. B62B 3/002

OTHER PUBLICATIONS

Lande.com; "Set & Stack Wall Mounting Cabinet (Non-Patent Literature)"; printed on Jan. 5, 2021 from webpage: https://lande.com.tr/EN/WallMounting/11SetStack.html; 1 page.

\* cited by examiner

*Primary Examiner* — Jerry Wu
(74) *Attorney, Agent, or Firm* — Hewlett Packard Enterprise Patent Department

(57) ABSTRACT

The present subject matter relates to an expandable housing for a computing system like a server. For example, the expandable housing with one or more rack units is formed by a plurality of extruded structural members. A first rack unit is formed on the at least one first base member through a first set of extruded structural members. The first set of extruded structural members are connected with each with a plurality of first interconnecting contact joints for contact and engagement therebetween. A second rack unit is formed on the first rack unit and a second set of extruded structural members are connected with each through a plurality of second interconnecting contact joints.

14 Claims, 10 Drawing Sheets

EXPANDABLE HOUSING FOR A COMPUTING SYSTEM

TECHNICAL FIELD

The present subject matter relates to a housing for a computing system, and more particularly relates to an expandable housing for the computing system and a method for building the expandable housing.

BACKGROUND

Generally, computing systems, for example, servers, network switches or the like, have attained prominence due to their use in wide variety of applications. Considering the example of servers, they incorporate various electrical/electronic components and modules that include, but not limited to, storage devices, processors, power sources etc. These electrical/electronic components and modules are mounted to a housing, which acts a chassis for providing structural support. The housing along with the electrical/electronic components gets mounted to a rack. Generally, the housing is manufactured in standard size so that they can be used for various small form factor and large form factor computing system applications.

BRIEF DESCRIPTION OF DRAWINGS

The present subject matter can be best understood by referring to the following description and the accompanying drawings that are used to illustrate example(s) of the present subject matter.

DETAILED DESCRIPTION

Figure 1:
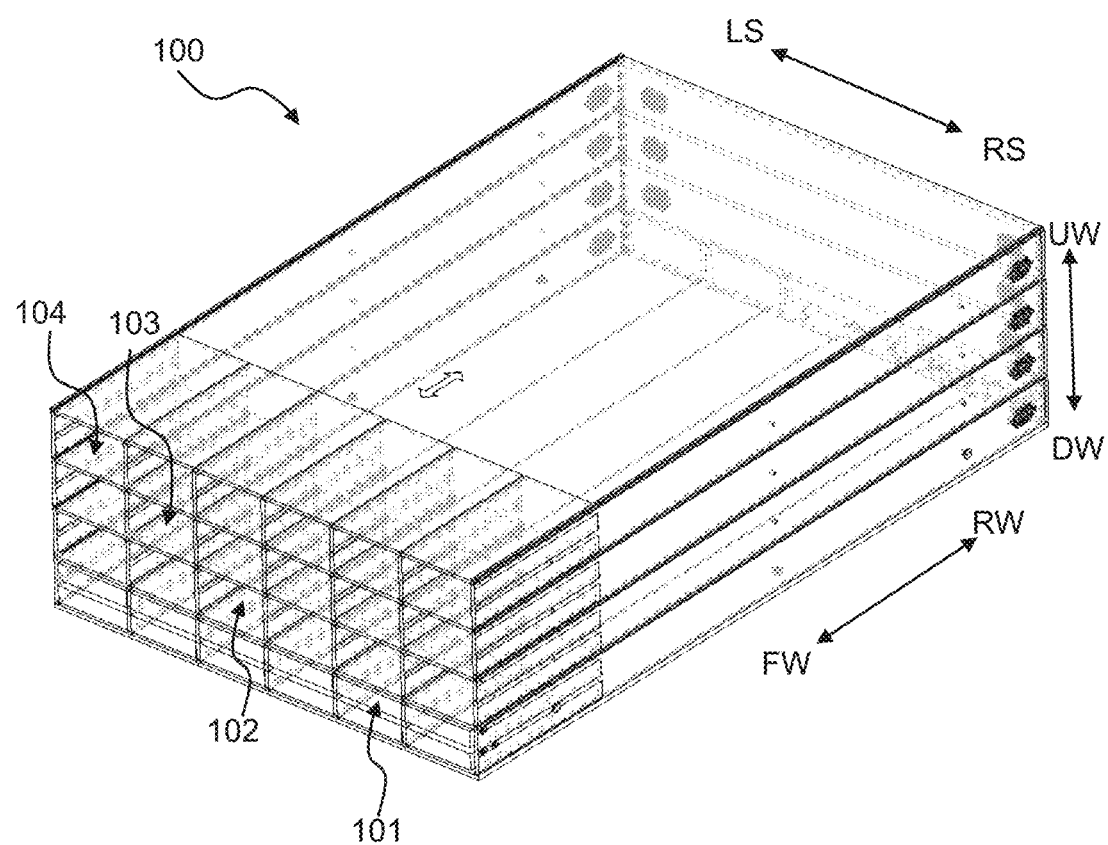
FIG. 1 illustrates a schematic perspective view of an expandable housing, in accordance with an example of the present subject matter.

A chassis for a server may be made of sheet metal and manufactured with a pre-defined height/configuration in order to cater to various form factors of the server. Thus, typically, multiple chassis structures are designed and manufactured in order to be used with various form factors. These multiple chassis structures need to be manufactured and maintained at warehouse or supply hubs. The fully manufactured/assembled chassis occupies large space at the storage locations and takes-up large volume during transportation and the structures are prone to damage during transportation, which may be caused due to use of sheet metal. Moreover, certain other chassis designs use an additional structure to connect two components of the chassis. Such designs involve multiple joints, which increases number of weak points (joints and child parts may become weak points of the structure).

Further, with some chassis designs, during an upgrade of the server, a new server chassis is used. This makes the earlier chassis structure obsolete. Chassis with expandable structures use sheet metal for construction. Thus, the aforementioned expandable structures may still have structural compromise and also, involves complex manufacturing steps and associated tooling costs. Further, structural failure of the chassis causes serious damage to the electronic components and may bring down the entire system causing major physical damage and data loss.

The present subject matter is aimed at addressing the aforementioned and other technical short comings. The present subject matter provides an expandable housing for a computing system like a server. One or more rack units can be built as per demand/requirement. When required, additional rack unit(s) can be built over the available expandable housing (with one or more rack units). The rack units are built from extruded structural members. Each extruded structural member of the plurality of extruded structural members have integrally formed engaging/receiving portions to establish interconnecting contact joints, which allow the extruded structural members to connect to each other to form the rack units.

As per one example, a first rack unit formed on the at least one first base member. The first rack unit comprising a first set of extruded structural members. The first set of extruded structural members are connected to each other through a plurality of first interconnecting contact joints to form the first rack unit. A second rack unit is formed on the first rack unit and the second rack unit comprises a second set of extruded structural members. The second set of extruded structural members are connected to each other through a plurality of second interconnecting contact joints to form the second rack unit. The 'first set of extruded structural members' and 'second set of extruded structural members' may be collectively referred to as 'plurality of extruded structural members.'

The plurality of second interconnecting contact joints are similar to the plurality of first interconnecting contact joints.

Explanation provided for the first interconnecting joints applies to the second interconnecting contact joints.

It is an aspect that the plurality of extruded structural members includes at least one first base member that supports the expandable housing entirely. In one example, the first base member can be a regular base structure. The at least one first base member acts as a common base irrespective of any number of rack units being built.

It is an aspect that a first rack unit is formed on the at least one first base member by use of a first set of extruded structural members. Each extruded structural member of the first set of extruded structural members comprises at least one interconnecting contact joint for establishing connection/joint with another extruded structural member. In other words, the first set of extruded structural members are connected with each other through a plurality of first interconnecting contact joints. For example, a first interconnecting contact joint is formed by a portion of one extruded structural member engaging with a complementing portion of another extruded structural member. Due to direct contact and engagement (positive joint) between the extruded structural members, need for any additional intermediate structural member, for connection of two structures, is avoided.

It is an aspect that a second rack unit comprises a second set of extruded structural members. The second set of extruded structural members of the expandable housing are used for forming additional rack unit over the first rack unit in a stacked manner. Similarly, additional rack units can be appended on the existing rack units of the expandable housing to cater to any change in configuration of the computing system.

It is an aspect that the first set of extruded structural members include a first side wall, and a second side wall that are mounted to the at least one first base member. The first side wall is mounted at one lateral end, of the at least one first base member, through a first-joint and the second side wall is mounted at other lateral end, of the at least one first base member, through a second-joint. The first-joint and the second-joint are part of the plurality of first interconnecting contact joints. Right from the formation of the first side wall and the second side wall, the interconnecting contact joints are provided. The extruded structural members have minimal tolerances and variations thereby offering precision assembly of the extruded structural members.

It is an aspect that the first set of extruded structural members further include a first rear wall, which is mounted to the first side wall and the second side wall through a third-joint of the plurality of first interconnecting contact joints. In one example, the first rear wall is slidably mounted to the first side wall and the second side wall, and rests on the at least one first base member. Addition of each extruded structural member improves sturdiness of the expandable housing.

It is an aspect that the at least one first base member comprises a first receiving portion and a second receiving portion, on an upward face, for connecting with the first side wall and the second side wall, respectively, through a first engaging portion and a second engaging portion of the first side wall and the second side wall, respectively. The first-joint is formed by the first receiving portion and the first engaging portion & the second-joint is formed between the second receiving portion and the second engaging portion.

It is an aspect that the first set of extruded structural members include a first top wall. The first top wall is mounted to the first side wall and the second side wall at a front portion thereof through a third-joint of the plurality of first interconnecting joints. The first top wall provided at the front portion defines space (between the first top wall and the at least one first base portion) for mounting storage devices including hard disk drives (HDDs).

It is an aspect that the first top wall is also supported by a plurality of first vertical walls of the first set of extruded structural members. The plurality of first vertical walls is disposed between the first top wall and the at least one first base member and the plurality of first vertical walls are disposed orthogonally to the first top wall and the at least one first base member. The plurality of first vertical walls is secured to the first vertical wall and the first base member through a fifth-joint of the plurality of first interconnecting contact joints. The plurality of vertical walls is spaced apart thereby acting as horizontal partitions for mounting storage devices. Further, the plurality of vertical walls can be reconfigured to serve large form factor or small form factor storage devices. Load due to addition of additional rack units is borne by first vertical walls and the side walls thereby reducing load concentration at a single region on the first base member.

It is an aspect that the plurality of first vertical walls comprises a first profile portion for supporting a plurality of first horizontal members thereby creating additional partition in vertical direction. In another example, the first profile portion is used to support storage devices on top and bottom. In one example, the first profile portion is an extended portion, which protrudes outward from rest of the first vertical wall. The extended portion of the first vertical wall is configured to support the first horizontal wall/storage devices thereon.

It is an aspect that a contact portion is formed between a first extruded structural member and a second extruded structural member (say, from the first set of structural members) that are connected with each other. A true length of the contact portion is greater than a first width of at least one of the first extruded structural member and the second extruded structural member that are disposed in connection. The first extruded structural member and second extruded structural member are thus disposed with a large contact portion and a positive joint.

It is an aspect that one extruded structural member comprises an engaging portion and other extruded structural member comprises a receiving portion for establishing a positive joint/connection. The term 'positive joint' used herein implies that the connection/joint forms a locking connection. The first set of extruded structural members and the second set of extruded structural members It is an aspect that the extruded structural members are formed of aluminium, as per one example. The extruded structural members are formed like blocks, unlike sheet metal structures. The weight of the extruded structural members (which is heavier than typical computing system structures) positively provides structural stability and strength. Even though aluminium is preferred, metals or alloys that exhibit physical and thermal properties similar to aluminium can also be used. The entire expandable housing that is made of aluminium acts as a heat sink, which is critical requirement for computing systems which dissipate lot of heat.

It is an aspect that the extruded structural members include a first extruded structural member comprising a receiving portion on a first side and an engaging portion on a second side, both being disposed within a first selected region. In one example, the first selected region includes an area on either side of the receiving portion extending till a first distance, which is equal to at least a length of the receiving portion (groove). The reduction in material due to the receiving portion is compensated by the engaging portion being disposed within the first selected region.

It is an aspect that each of the extruded structural members is having a substantially uniform thickness, and the plurality of extruded structural members is configured to be stackable in a disassembled condition. The space required for shipping of the extruded structural members for building of rack units is optimal as stacking of the extruded structural members one over the other occupies less space. The extruded structural member comprises a block like structure with planar surface/profile (due to substantial uniform thickness), which enables the extruded structural members to be stacked with negligible deformation during storage and transportation.

It is an aspect that each of the plurality of first interconnecting contact joints and the plurality of second interconnecting contact joints comprises a non-linear profile and the interconnecting contact joint is formed between the integrally formed portions (receiving portion/engaging portion) of each of the plurality of extruded structural members.

In one example, the interconnecting contact joint is having a non-linear profile thereby offering larger contact between extruded structural members that are connected to each other. For example, a dovetail joint forms the interconnecting contact joint between two extruded structural members. The non-linear profile implies that when traversing along contact surfaces between the extruded structural members, a non-linear path is obtained.

The expandable housing can be knocked down (into individual pieces) to store the structural members in an efficient manner thereby reducing volume/storage requirements. Further, all the walls are formed by the extruded structural members whereby any weak points in the expandable housing are reduced/eliminated. Furthermore, the plurality of extruded structural members provides the structural rigidity needed for supporting various server components while still being modular. Furthermore, the interconnecting contact joints between the plurality of structural members provides effective contact between structural members offering improved load sharing. The 'effective contact' indicates that the contact between the extruded structural is large (when compared to conventional designs), whereby a load sharing between the extruded structural members is not concentrated on any one extruded structural member and is shared by all the extruded structural members disposed in contact.

The present subject matter provides a method of constructing the expandable housing, which is discussed in the later part of the description.

It is a feature of the present subject matter that the disassembled extruded structural members can be easily stacked and transported. At the customer end or deployment area, the rack units can be easily installed.

It is a feature that costs that may occur due to logistics/shipment handling is reduced as the disassembled structural members require less volume for storage and for transportation.

It is a feature that scalability of rack units is easy as additional rack units can be built upon the existing rack units (of the expandable housing). The interconnecting contact joints with complementing profiles make the assembly intuitive thereby reducing/eliminating need for expert personnel.

It is a feature that the extruded structural members provide aesthetic appearance as requirements of fasteners is reduced and even if required, fasteners like grub screws can be used with minimal exposure.

In one example, at least a portion of exterior surface of the expandable housing is hardened to form a rigid layer at the periphery to withstand any shocks or any impact.

In the figures, certain features and components may be exaggerated in scale or in schematic form, and certain details of few elements may not be shown in the interest of clarity and conciseness.

As used herein, unless otherwise specified, the use of the terms "first", "second", "third", "one", "other", "another" etc., to describe a similar element, merely indicate that different instances of similar elements are being referred to, and are not intended to imply that the elements so described must be in a given sequence, either temporally, spatially, in ranking, or in any other manner.

FIG. 1 illustrates an example of an expandable housing 100. Referring to FIG. 1, various arrows are used to represent the following: FW represents forward direction, RW represents rearward direction, LS represents left side, RS represents right side, UW represents upward direction, and DW represents downward direction. FW-RW represents longitudinal direction, and RS-LS represents lateral direction. Similar references are used throughout the discussion even if not explicitly marked in the drawings.

The expandable housing 100, in the depicted example, comprises four rack units with a first rack unit 101, a second rack unit 102, a third rack unit 103, and a fourth rack unit 104. Rack units that are built over the first rack unit may be referred to as additional rack units. Each rack unit is formed atop another rack unit in a vertical orientation. The expandable housing 100 is configured to house and supporting various electrical/electronic components and modules. The expandable housing 100 may be formed of one or more rack units based on form factor of the computing system and based on demand/requirement from user. Further, a user can add additional rack units above the fourth rack unit 104 in order to accommodate any changes in form factor of the upgraded system. The expandable housing 100 is configured to accommodate a computing system that may be a server, a network switch or a similar computing or a storage device. The features of the expandable housing 100 is elaborated through subsequent examples.

FIGS. 2-5 illustrate various schematic views of another example of an expandable housing 100' comprising only a single rack unit i.e. a first rack unit 101. The first rack unit 101 is formed by a first set of extruded structural members. As per one example, each extruded structural member is created by pushing material like aluminium through a die thereby attaining desired structural shape. In one example, the first set of extruded structural members is made of aluminium, which is capable of providing the structural strength without any problem of corrosion. The expandable housing 100' includes at least one first base member 110. For ease, the 'at least one first base member' is referred to as 'first base member' without any limitation of scope. The first base member 110 acts as a base that supports the entire expandable housing 100 (as shown in FIG. 1), 100', 100" irrespective of number of rack units. In other words, the first base member 110 acts as a common base even upon expansion of the expandable housing 100' in a vertical direction when appending additional rack units to turn it into expandable housing 100 (as shown in FIG. 1). In another example, the first base member 110 may be reinforced to support the entire expandable housing 100, 100' either during the extrusion thereof or after the extrusion. For instance, the extruded structural member is reinforced by heat treatment, or by quenching using air and/water to strengthen thereby minimize any distortions of the extruded structural members.

Further, the extruded structural members that are associated with formation of the first rack unit 101 are referred to as 'first set of extruded structural members.' In the depicted example, the first base member 110, a first side wall 120, a second side wall 125, a first rear wall 130, a plurality of first vertical walls 135 (considering ease of representation, only one first vertical wall is marked), a plurality of first horizontal walls 140 (considering ease of representation, only one first horizontal wall is marked), and a first top wall 145 form part of the first set of extruded structural members. Further, the first set of extruded structural member are connected with each other through a plurality of first interconnecting contact joints 150 (one example illustrated in FIG. 4). The portions of the extruded structural members that are used to form the interconnecting joints are preferably integrally formed during the extrusion process or after the extrusion process of formation each of the first set of extruded structural members. For example, each extruded structural member comprises a profile for forming interconnecting contact joint with another extruded structural member. The profile is integrally formed with the extruded structural member during the extrusion process using a die or the like. In other example, the extruded structural member requires additional tooling to form the profiles for interconnecting contact joint. Through the plurality of first interconnecting contact joints 150, the first set of extruded structural members engage with each other thereby eliminating the need for any additional intermittent members for connection.

Further, the first base member 110 comprises a first receiving portion 111 (shown in enlarged portion of a front portion in FIG. 3) that is used for establishing a first-joint 111&124 of the plurality of first interconnecting contact joints. The first receiving portion 111 is formed on upward facing side of the first base member 110 towards one lateral side (for example, right side RS in the illustrated example). In one example, the first receiving portion extends along entire longitudinal length FW-RW of the first base member 110. Correspondingly, the first side wall 120 comprises a first engaging portion 124 (shown in enlarged portion of FIG. 3) that is used for forming the first-joint 111&124. A downward facing side of the first side wall 120 comprises the first engaging portion 124. The interconnecting contact joint is configured to establish a connection/joint and at the same time provide a large contact portion between the extruded structural members. For example, the first receiving portion comprises a dovetail shaped groove and the first engaging portion comprises a dovetail shaped protrusion or vice-versa. The first engaging portion complements the profile of the first receiving portion for engagement therebetween.

Figure 3:
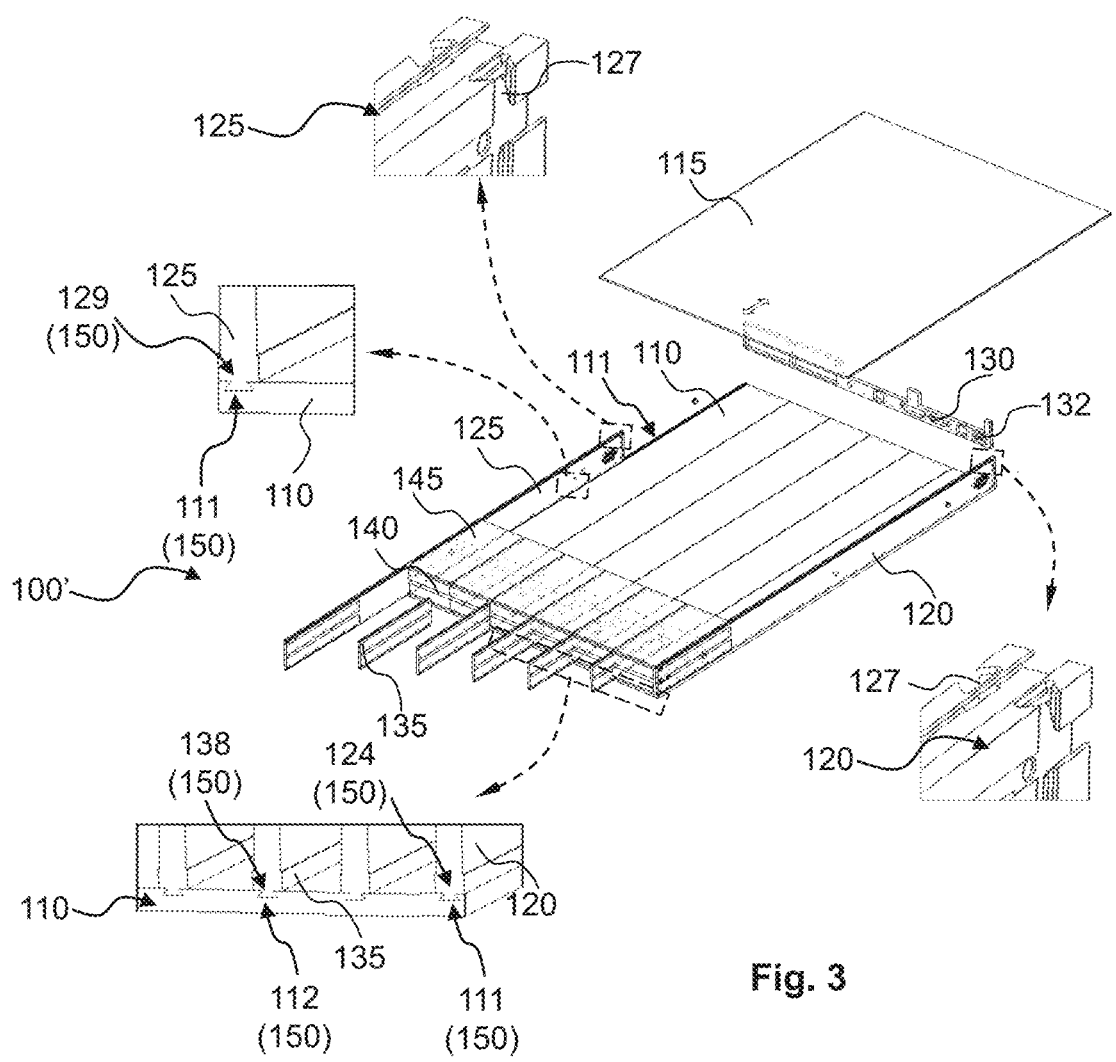
FIG. 3 illustrates a schematic partial exploded view of the expandable housing, in accordance with the example as illustrated in FIG. 2.

In the illustrated example, as shown in FIG. 3, the first side wall 120 is slidably mounted to the first base member 110 through a downward facing side thereof. Similarly, the second side wall 125 comprises a second-joint 111&129 of the plurality of first interconnecting contact joints with the first base member 110 whereby the second side wall 125 is slidably mountable to the first base member 110 and is disposed at other end in the lateral direction RH-LH. For example, the second side wall 125 comprises a second engaging portion 129 and the first base member 110 comprises a second receiving portion 111 (same reference sign is used for first receiving portion and the second receiving portion i.e. 111) for engagement therebetween.

Figure 2:
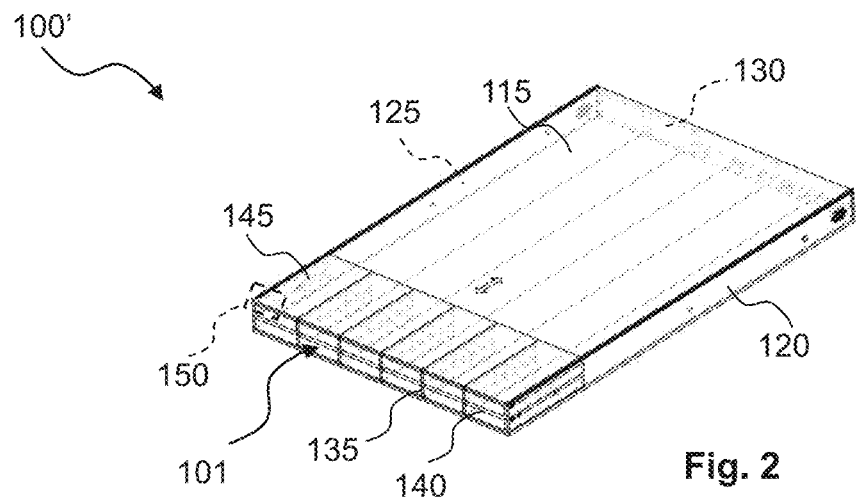
FIG. 2 illustrates a schematic perspective view of another expandable housing, in an assembled condition, in accordance with an example of the present subject matter.

Further, referring to FIG. 3 in conjunction with FIG. 2, the first rear wall 130 is configured to slidably engage with the first side wall 120 and the second side wall 125 through a third-joint of the plurality of first interconnecting contact joints. For example, a third receiving portion 127 (shown in enlarged portion of FIG. 3) is provided on an inward facing side of the first side wall 120 and the second side wall 125. Correspondingly, a third engaging portion (not shown) is provided on either ends of the first rear wall 130 for engaging with the third receiving portion 127. The third receiving portion 127 (of the first side wall and of the second side wall) and the third engaging portion (provided on either ends of first rear wall) form the third-joints. The first rear wall 130 comprises a plurality of apertures 132 for establishing electrical connections with components that get mounted to the first rack unit 101 therethrough. The first rear wall 130 is mounted in a vertical orientation and is mounted orthogonally to the first side wall 120, the second side wall 125, and the first base member 110. Further, the first base member 110 comprises a plurality of fourth receiving portions 112 (shown in FIG. 3) that are formed at a front portion thereof and between the first receiving portion 111 and the second receiving portion 111. The plurality of fourth receiving portions 112 are configured to receive corresponding plurality of fourth engaging portions 138 of the plurality of first vertical walls 135 thereby creating partition in horizontal direction. The first vertical walls 135 are connected with the first top wall 145 and the at least one first base member 110 through the a fifth-joint 112&138 of the plurality of first interconnecting contact joints 150. In the illustrated example, the plurality of first vertical walls 135 are uniformly spaced apart. However, in another example, the plurality of first vertical walls may be non-uniformly spaced apart depending on the size/formfactor of the storage devices that get mounted thereat.

Each first horizontal wall of the plurality of first horizontal walls 140 is mounted to—two adjacently disposed first vertical walls 135 or—the first side wall 120/the second side wall 125 & an adjacently disposed first vertical wall 135. The plurality of first horizontal walls 140 establish interconnecting contact joint for engagement with the first base member 110. By utilizing the first horizontal walls 140 a small factor requirement for storage devices can be met. Further, the first top wall 145 is mounted to the plurality of the first vertical wall 135 by engagement through the interconnecting contact joints. However, the first top wall 145 forms a partial top enclosing portion of the first rack unit 101. The first top lid 115 is mounted to the first side wall 120 and the second side wall 125 through a fourth-joint of the plurality of first interconnecting joints 150 thereby forming top enclosure of the first rack unit 101. The plurality of first horizontal walls 140 and the first top wall 145 extend at least a partial length of the first rack unit 101 and are configured to support storages device like a hard disk. The first top wall 145 and the first top lid 115 together form the top enclosure and the first top lid can be selectively removed without disturbing the components mounted at the front portion of the first rack unit 101.

Figure 4:
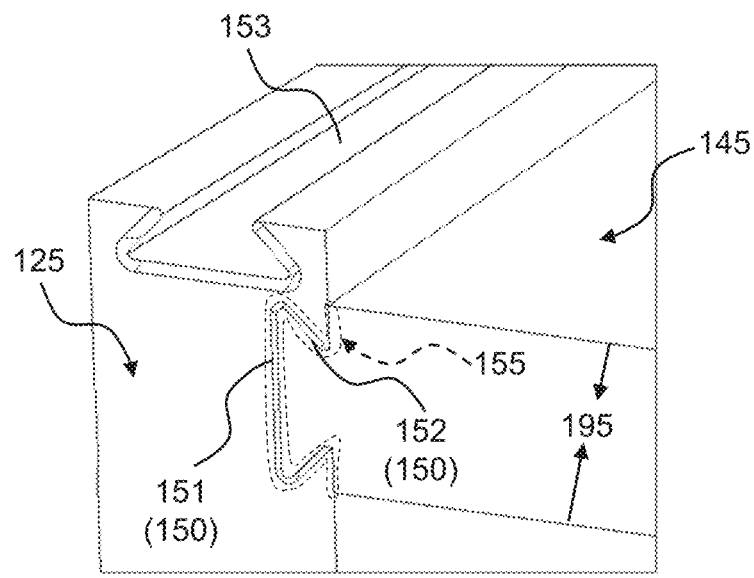
FIG. 4 illustrates a schematic enlarged view of a portion of the expandable housing, in accordance with the example as illustrated in FIG. 2.
Figure 5:
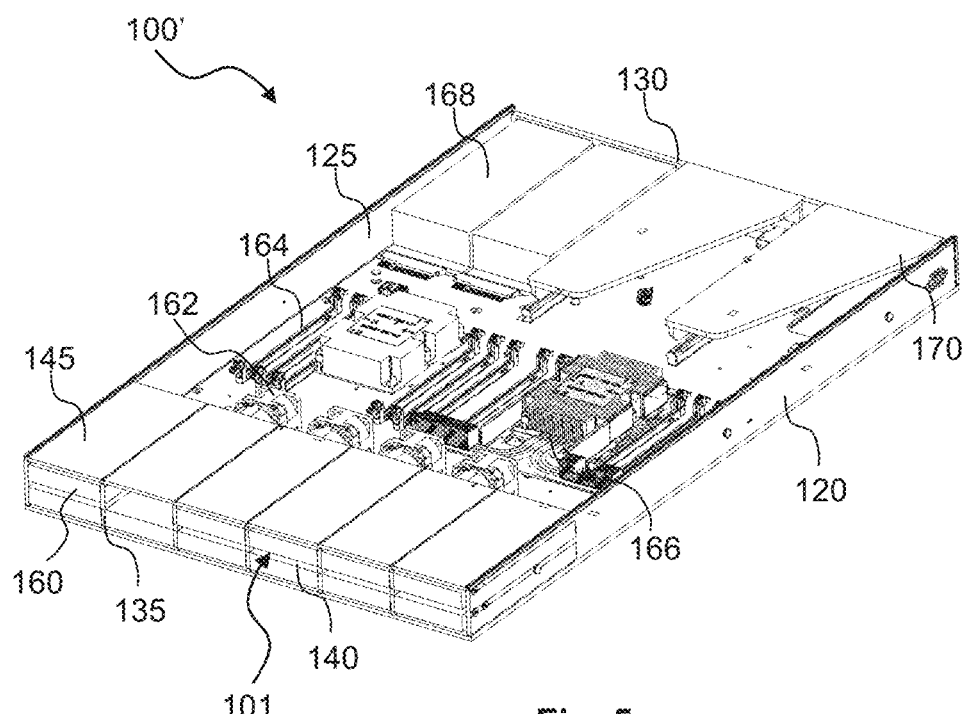
FIG. 5 illustrates a schematic perspective view of an expandable housing with components mounted thereon, in accordance with the example as illustrated in FIG. 2.

An enlarged view of exemplary first interconnecting contact joint 150 between a first top wall 145 that is connected to the second side wall 125 is illustrated in FIG. 4. In the example, the one receiving portion 151 of the second side wall 125 is a dove tail shaped groove. Correspondingly, the one engaging portion 152 is a dove tail shaped protrusion. For brevity, only one enlarged view is shown, similarly first interconnecting contact joints are provided for engagement between the first set of extruded structural members. The engaging portion 152 is configured to slidably engage with the second side wall 125 through an appropriate fit. In one example, the type of fit can be an interference fit. In another example, the type of fit can be clearance fit/transition fit with minimal clearance and in such a case, an additional fastening member including bolts, grub screws, tap screws or the like are provided. Further, a contact portion 155 between the second side wall 125 and the first top wall 145 is schematically shown within the dotted line. Further, the second side wall 125 comprises an additional receiving portion 153 for engaging and supporting a fourth side wall 126. The fourth side wall 126 comprises a receiving portion to support another extruded structural member to form a third rack unit on top.

When a true length of the contact portion 155 is considered, it is substantially greater than a first width 195 of at least one of the first set of extruded structural members that are being connected. Herein, the term 'true length' is the measured by traversing along the profile of the contact portion 155. In the illustrated example, the true length is greater than a first width 195 of first top wall 145 or the second side wall 125. In one example, the contact portion 155 is at least 1.5 times the first width 195 of at least one of the extruded structural members that are connected. The interconnecting contact joint i.e. the receiving portion/the engaging portion provide a larger contact area between the extruded structural members. Any known non-linear profile (herein, the non-linear profile is a transversal path along the surface of the profile that is non-linear), like dovetail, may be used for secure connection between the extruded structural members for providing effective load sharing therebetween. Further, the extruded structural members, which are skeletal structures of the expandable housing, itself are involved in load sharing without the need for any intermediate reinforcing structures.

Each of the rack unit can be customized to accommodate the components/modules thereon. In the schematic illustration of FIG. 5, the first rack unit 101 is populated with electrical/electronic components/modules. At the front of the first rack unit 101 plurality of storage devices 160 are provided. Further, in the depicted example, four cooling fans 162 are mounted adjacently rearward to the storage devices 160. The first base member 110 supports a plurality of memory modules 164, at least one processing unit 166 and corresponding heatsinks, one or more power supplies 168, and one or more riser cages 170. The first rear wall 130 comprises apertures for enabling connection of ports that include, but not limited to, a power port, a network port, any known bus, or the like. In a detached condition of the first top lid 115, the expandable housing 100' provides access to the space define behind the first top wall 145 (when viewed in a plan view) and that space is configurable to populate power supplies, expansion cards and/or network cards as per demand.

Figure 6:
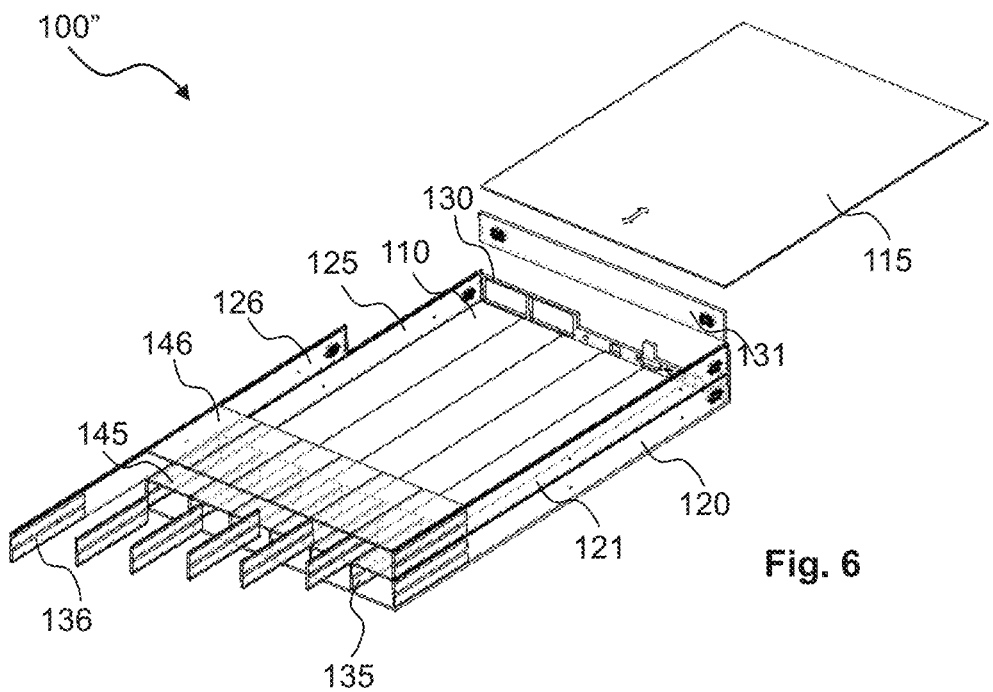
FIG. 6 illustrates a schematic partial exploded view of an expandable housing with two rack units, in accordance with an example of the present subject matter.
Figure 7:
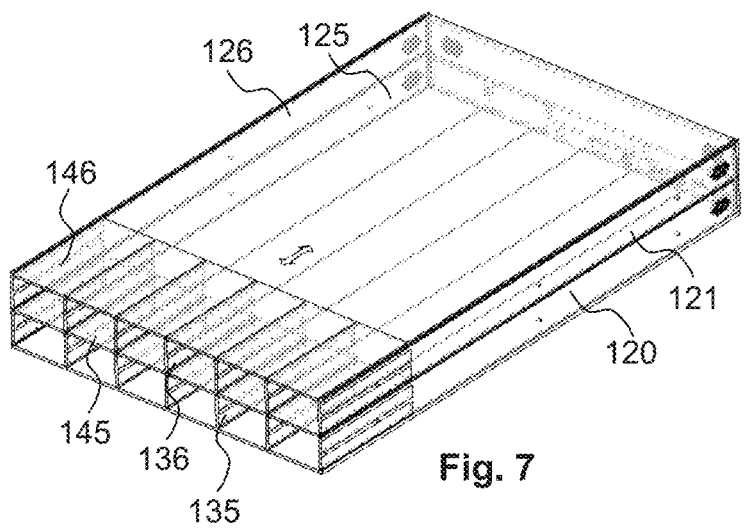
FIG. 7 illustrates a schematic front perspective view of an expandable housing, in accordance with the example of FIG. 6.
Figure 8:
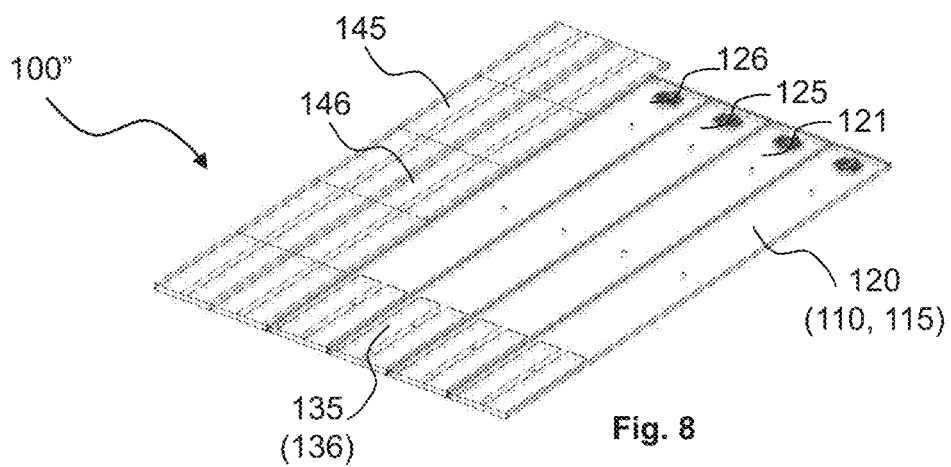
FIG. 8 illustrates a schematic disassembled view of an expandable housing, in accordance with the example of FIG. 6.

Further, the first side wall 120, the second side wall 125, the first top wall 145, and the first rear wall 130 are configured to receive a second set of extruded structural members to form a second rack unit 102 atop the first rack unit 101. FIGS. 6 & 7 illustrate a partial exploded view & an assembled view of the expandable housing 100". FIG. 8 illustrates the expandable housing 100" in a disassembled and stacked condition. The expandable housing 100" comprises a first rack unit 101 and a second rack unit 102. The second rack unit 102 is formed by a plurality of extruded structural members. During upgrade, which requires a change in form factor, the second rack unit 102 can be built on the first rack unit 101 with ease. In the depicted example, a third side wall 121 is slidable mounted to the first side wall 120 forming interconnecting contact joints (not shown).

Similarly, the fourth side wall 126 is slidably mounted to the second side wall 125 forming interconnecting contact joints (not shown). Further, a second rear wall 131 is mounted to the third side wall 121 and the fourth side wall 126. Further, at the front portion of the second rack unit 102, storage spaces for storing storage device is formed through a plurality of second vertical walls 136 and a second top wall 146. In one example, a common lid, referred to as the first top lid 115 gets mounted to the third side wall 121 and the fourth side wall 126. However, in another example, individual top lids can be provided for each of the first rack unit 101 and the second rack unit 102.

Further, as shown in FIG. 8, the plurality of extruded structural members that form the expandable housing 100" can be disassembled and stacked on one another. In the illustrates example, the first side wall 120, the second side wall 125, the third side wall 121, the fourth side wall, 126, the first top wall 145 and the second top wall 146 are stacked on top. The first base member 110, the first top lid 115, the plurality of first vertical walls 135, and the plurality of second vertical walls 136 are disposed below (hence, cannot be seen in the top perspective view). Hence, the first set of extruded members and the second set of extruded structural members are stackable in a disassembled condition with planar surface contact between any two extruded structural members. Unlike the conventional structures, say sheet metals, that are difficult to be stacked (due to their non-planar profiles) and their tendency to deform during transportation. The conventional structures are transported in an assembled condition. Whereas, the plurality of extruded structural members inherently possess substantial thickness and weight in order to be can be stacked while shipping and without any major concern of deformation.

Figure 9:
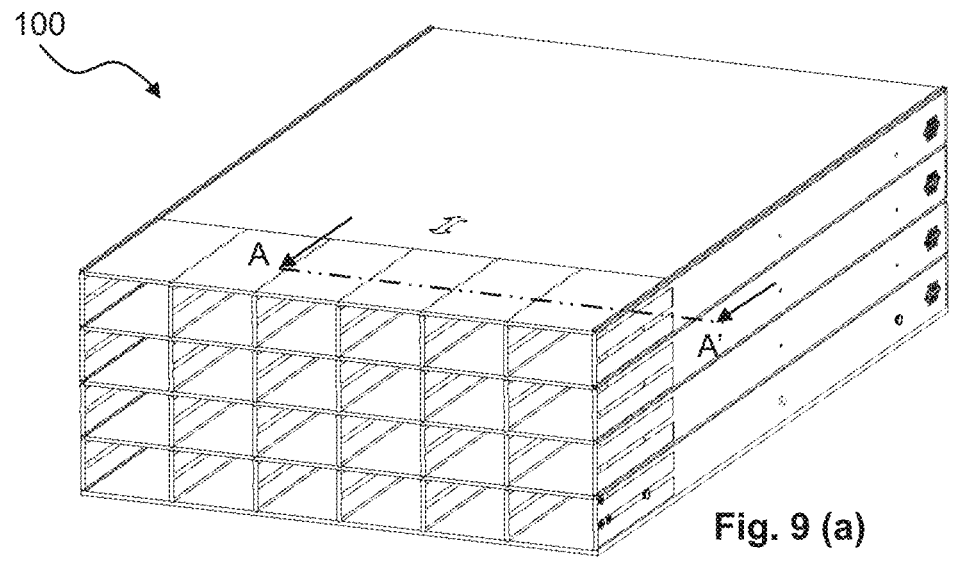
FIG. 9(a) illustrates a schematic front perspective view of an expandable housing with four rack units, in accordance with an example of the present subject matter.
FIG. 9(b) illustrates a sectional view of the expandable housing, the section being taken along axis A-A' as illustrated in FIG. 9(a).
Figure 9:
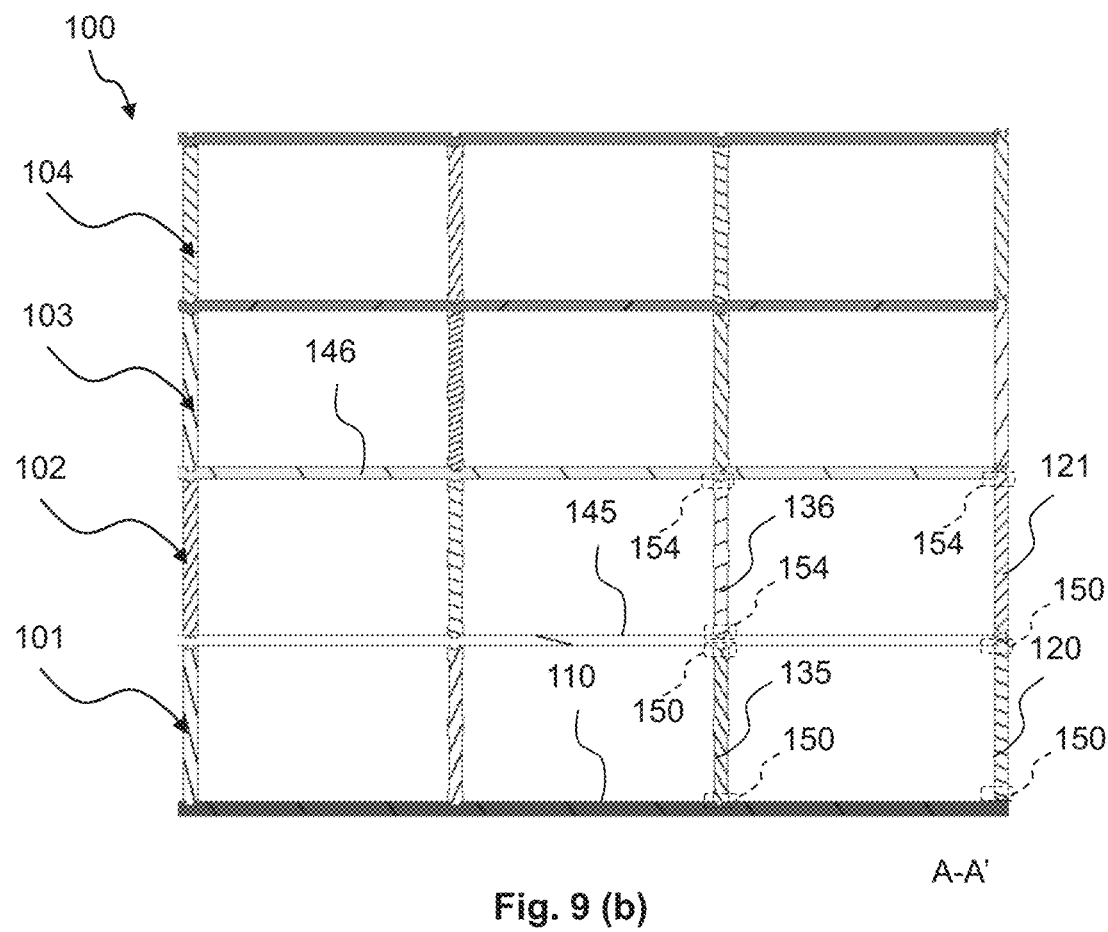

FIG. 9($b$) illustrates a sectional view of the expandable housing 100, the section being taken along axis A-A' of the expandable housing 100 as illustrated in FIG. 9($a$). The first set of extruded structural members, say 120, 135, 145 (as shown in FIG. 9($b$)), are connected to each other through the plurality of first interconnecting contact joints 150. Through the plurality of first interconnecting joints 150, the first set of structural members are connected to the at the at least with one first base member 110. Similarly, the second set of extruded structural members, say the second set of structural members 121, 136, 146 are connected to each other and with the first set of extruded structural member through the plurality of second interconnecting contact joints 154.

Each of the extruded structural member i.e. the first base member 110, the first side wall 120, the third side wall 121, the first vertical walls 135, the second vertical walls 136, the first top wall 145, and the second top wall 146 is having a substantially uniform thickness. In one example, the entire expandable housing 100 is made of extruded aluminium structures whereby the entire housing acts as heatsink for effective heat dissipation from the storage devices, the processing units, or the electrical power sources. In yet another example, a plurality of fins is provided on outward facing walls i.e. the first side wall, the second side wall or the first rear wall for further improved heat dissipation. Further, the aluminium extruded-extruded structural members with high thermal conductivity and with a contact portions 155 being longer, between the extruded structural members, enable effective heat transfer thereby limiting heat concentration at a certain region. Furthermore, the expandable housing 100 offers high electromagnetic interference (EMI) containment thereby making it feasible to be deployed even in tightly packed zones with minimal effect. Further, larger width of the expandable housing 100 when compared to the width of conventional sheet metal housings helps in effective heat dissipation and EMI containment.

Further, the substantial uniform thickness of the extruded structural members enables them to be mounted on one another in a disassembled condition (as illustrated in FIG. 3). The terms 'substantial' or 'substantially' refers to at least 80%. In other words, 'substantial uniform thickness' implies that 80% or more of the extruded structural member is having uniform thickness, which is sufficient for achieving the objective. The area (in terms of footprint) occupied by the expandable housing can be limited to the largest extruded structural member of the plurality of extruded structural members. In one example, the first base member 110 defines the area (length×depth) of the disassembled expandable housing, as the first base member 110 being the largest structure. The disassembled expandable housing 100 would have a maximum stacked-height approximately equal to four times an average width of extruded structural members and the stacked-height is less than half of an assembled-height of the expandable housing. Even for a maximum rack unit configuration, the stacked extruded structural members occupy smaller space due to the planar surface.

Figure 10:
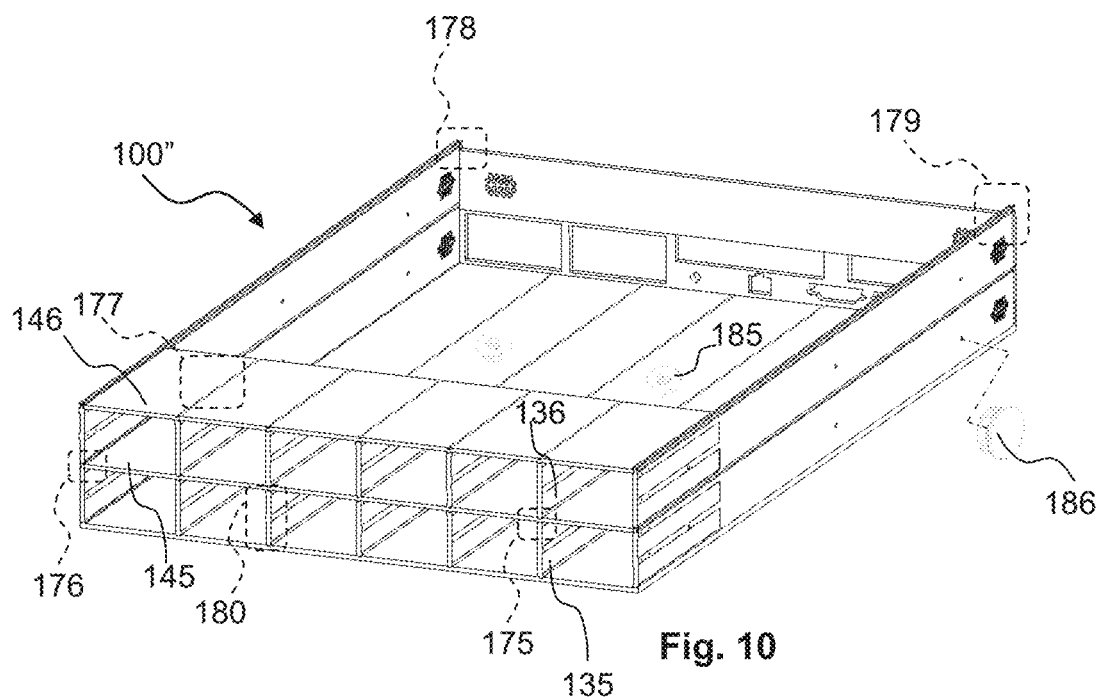
FIG. 10 illustrates another schematic view of an expandable housing with two rack units, in accordance with an example of the present subject matter.
Figure 11:
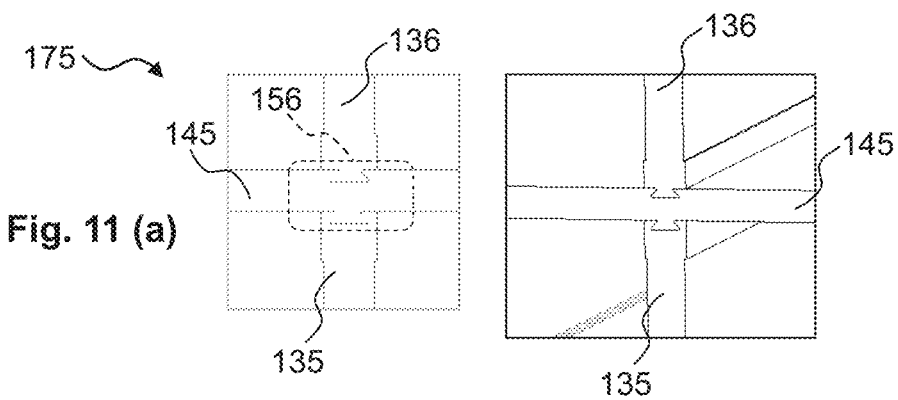
FIGS. 11(a)-11(f) illustrate schematic enlarged views of various of the expandable housing, in accordance with the example of the FIG. 10.
Figure 11:
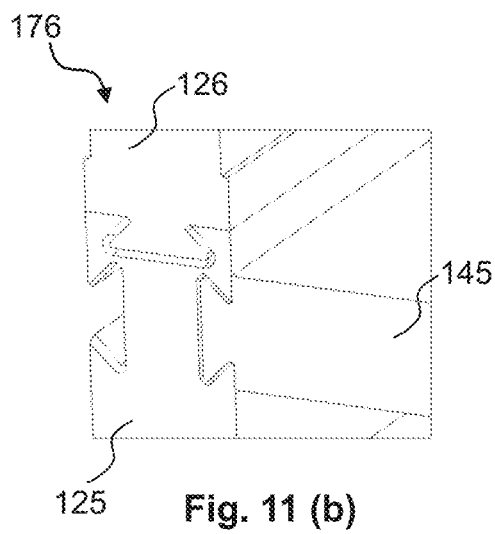
Figure 11:
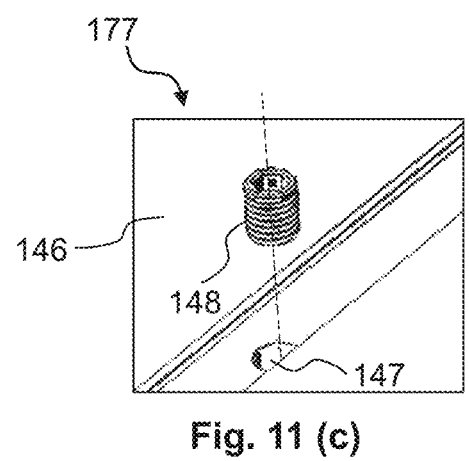
Figure 11:
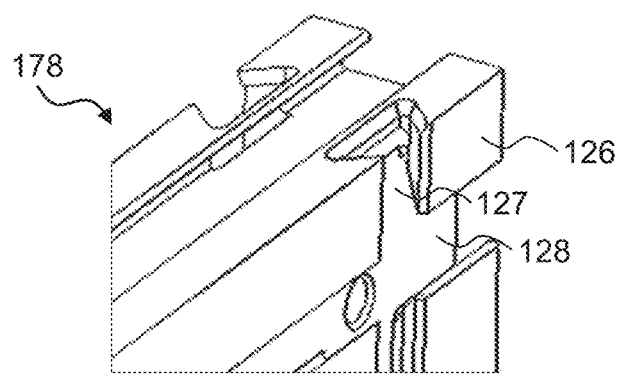
Figure 11:
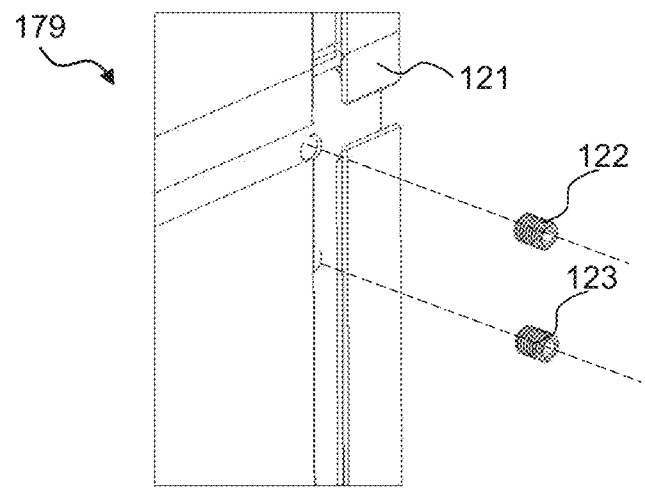
Figure 11:
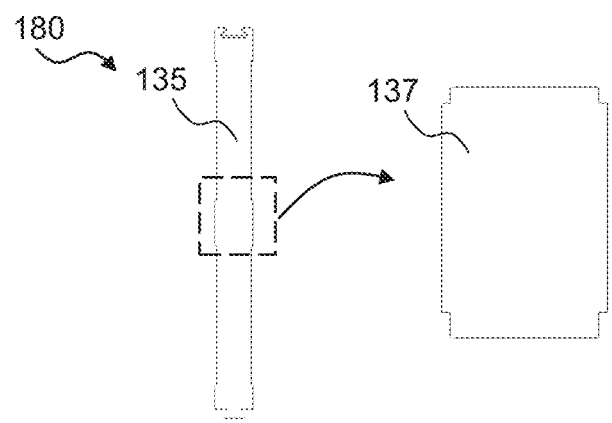

FIG. 11(a) illustrates an enlarged view of a region 175 of the expandable housing 100" shown in FIG. 10. The region 175 illustrates the interconnecting contact joint between the first top wall 145, the first vertical wall 135, and the second vertical wall 136. In the depicted example, the first top wall 145 extends along entire width, in lateral direction RS-LS, of the expandable housing 100". The first top wall 145 connects with all the plurality of first vertical walls 135 and with the first side wall 120 and the second side wall 125. Thus, the outermost side walls, the internal vertical walls and the top wall are all connected for effective load transfer between them. Even when additional rack units are appended on the first rack unit 101, load from the additional rack units and from the components is shared by the first vertical walls 135, the side walls 120 & 125 thereby eliminating any major load concentration and associated failures. In the illustrated example of FIG. 11(a), a first extruded structural member (say, the first top wall 145) comprises a receiving portion on side and an engaging portion on the other side, both being disposed within a first selected region 156, which is marked in dotted line. Even though a groove is formed for the receiving portion, the extruded structural member comprises a protrusion (say, engaging portion) within the first selected region. Thus, the width of the first top wall 145 (extruded structural member) is maintained (due to presence of groove and protrusion in proximity) to withstand load without any structural compromise. The first selected region 156 is a region on either side of the groove with a first distance, and the first distance being at least a length of the groove.

Similarly, FIG. 11(b) illustrates an enlarged view of a region 176 shown in FIG. 10. In the illustrated example, the second side wall 125 comprises three receiving portions. Two of the receiving portions are used for connecting the second side wall 125 to the first top wall 145 and the fourth side wall 126 of the second rack unit 102. Provision of the three receiving portions for the extruded structural members enables it to be used at any of the lateral sides. Thus, the ease of manufacturing is improved as the same tool can be used for manufacturing of the side walls for both lateral sides. Further, any of the side walls can be interchangeably assembled offering improved flexibility.

FIG. 11(c) illustrates a schematic exploded view of a region 177 illustrated in FIG. 10. As discussed in earlier part of the description, the extruded structural members are connected to each other through interconnecting contact joints, either through an interference fit or a clearance fit. In either of the fit schemes used, a fastener can be used to further provide additional fastening. In the illustrated example, a grub screw 148 is used for further fastening two of the extruded structural members. A fastener aperture 147 is provided for fastening the second top wall 146 to the second vertical wall 136 using the grub screw 148. By using the grub screw 148, a space occupied by a wide head of a bolt type structure is avoided. However, for ease of design and availability, a bolt type fastener or a tap screw may also be used. FIG. 11(d) an enlarged view of a rear portion of the fourth side wall, a region marked as 178 in FIG. 10. At the rear portion, the fourth side wall 126 may comprise four receiving portions. One receiving portion 127 (also referred to as 'third receiving portion') is provided on inward side for supporting the second rear wall 131 and another receiving portion 128 is provided to support the first top lid 115. Similarly, on outward facing side, two receiving portions may be provided to support the second rear wall 131 and the first top lid 115, which enables the fourth side wall design to be used even as the third side wall 121. FIG. 11(e) illustrates an enlarged view of a region 179 of the expandable housing illustrated in FIG. 10. In the depicted illustration, two grub screws 122, 123 are used to secure the third side wall 121 to the second rear wall 131 and the first top lid 115.

FIG. 11(f) illustrates a region 180, which is a front view of a first vertical wall 135 and an enlarged view of a mid-portion of the first vertical wall 135. The first vertical wall 135 is provided with a wider section to support the first horizontal wall 140 (as shown in FIG. 2). The wider section is referred to as a first profile portion 137 formed during extrusion on either side to support storage devices on top and bottom (above and below).

Further, FIG. 10 illustrates an exemplary shoulder pin 186 that is provided on outer side of the expandable housing 100". A plurality of shoulder pins 186 is mounted to the sides for mounting the expandable housing 100" to a rail, which forms part a rack assembly that support the expandable housing 100". One or more standoffs 185 are provided on the first base member 110, which acts as a separator with a defined length used for assembling parts above it.

FIGS. 12(a)-12(e) illustrate examples of interconnecting contact joint between two extruded structural members. For ease of explanation, one extruded structural member is considered as a portion of a first side wall and another extruded structural member is considered as a portion of a first top lid.

Figure 12:
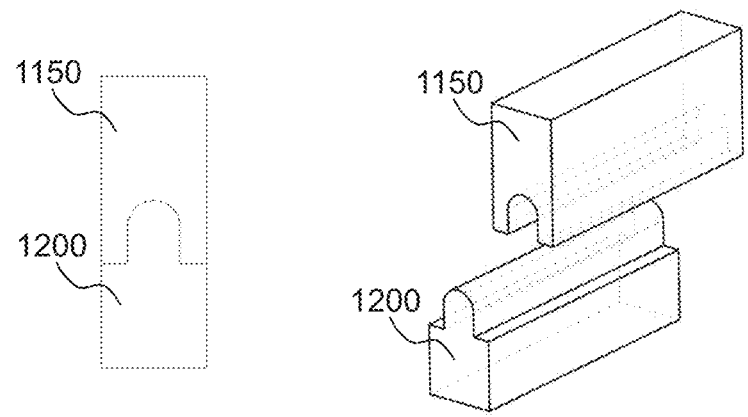
FIGS. 12(a)-12(e) illustrate examples of interconnecting contact joint between the structural members.
Figure 12:
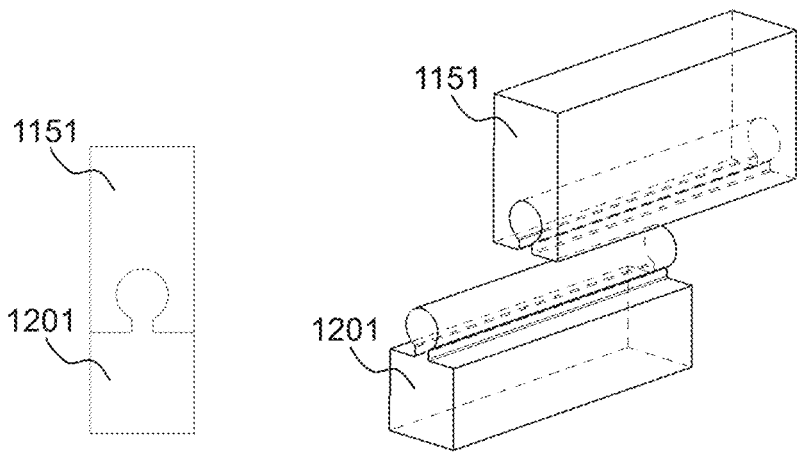
Figure 12:
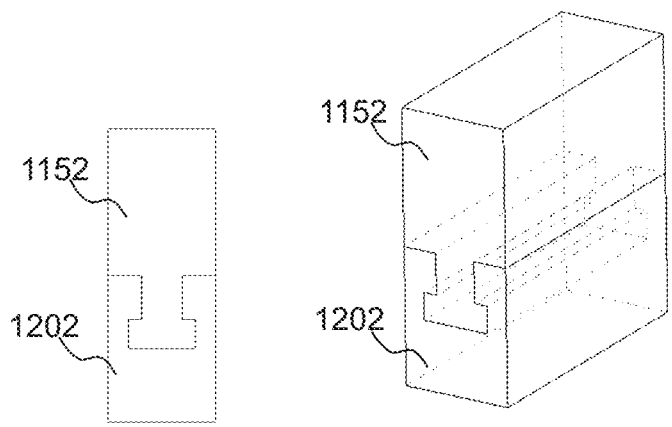
Figure 12:
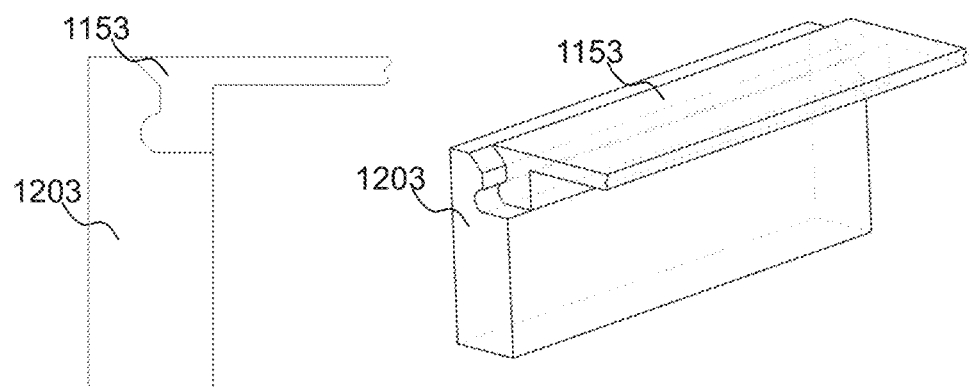
Figure 12:
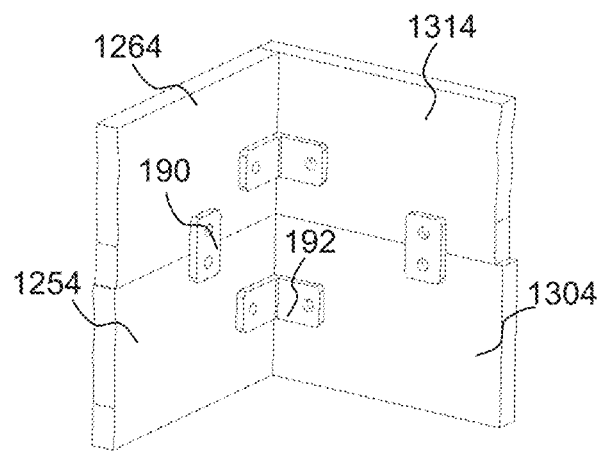

As illustrated in example of FIG. 12(a), a first side wall 1200 and a first top lid 1150 are connected through interconnecting contact joints. On the first side wall 1200 is an engaging portion formed in the shape of a U-shaped protruded structure. A complementing receiving portion is provided on the first top lid 1150, which is formed in the shape of a U-shaped groove. The U-shaped groove and the U-shaped protrusion offer non-linear profile at the contact portion. In one example, an interference fit is provided between the engaging portion and the receiving portion. In another example, a clearance fit may be provided in combination with a fastener.

In another example illustrated in FIG. 12(b), an exploded view and an assembled view of a portion of a first side wall 1201 and a first top lid 1151 are shown. In the current example, a receiving portion is provided on the first top lid 1151 with an Omega shaped groove. An engaging portion is provided on the first side wall 1201, which is having an Omega shaped protrusion. Similar to earlier example, an interference fit, or a clearance fit may be provided. In the current example, the Omega-shaped groove and the Omega-shaped protrusion offer non-linear profile.

In yet another example illustrated in FIG. 12(c), a first side wall 1202 is provided with a groove having a partial wider section. Similarly, a first top lid 1152 is provided with a protruded portion having a partial wider section that complements the groove provided on the first side wall 1202. The examples illustrated in FIGS. 12(a)-12(c), the engagements through the interconnecting portion occurs through slidable engagement thereby offering effective connection between the extruded structural members.

FIG. 12(d) illustrates an additional example, showing an interconnecting contact joint between an exemplary first side wall 1203 and first top lid 1153. The interconnecting contact joint is formed in an irregular shape yet offering a larger contact portion between the extruded structural members due to non-linear profile. Any known regular and irregular geometrical profile may be used to achieve the contact portion.

FIG. 12(e) illustrates yet another additional example, showing a flat contact between extruded structural members. In the depicted example, a second side wall 1254 and a fourth side wall 1264, & a first rear wall 1304 and a second rear wall 1314 are connected through strip plates 190, 192.

Figure 13:
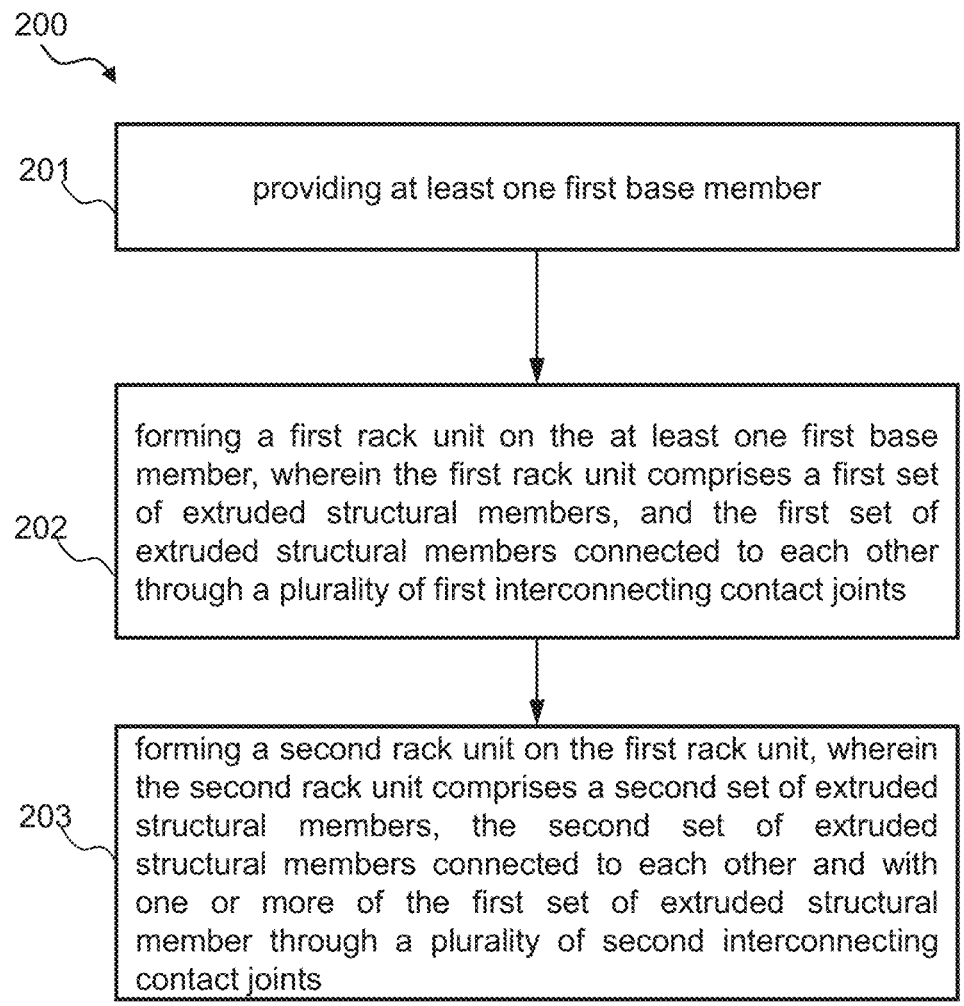
FIG. 13 illustrates an exemplary flow chart for a method of building an expandable housing, in accordance with an example of the present subject matter.

FIG. 13 illustrates an exemplary method 200 of forming the expandable housing 100, 100', 100". The method 200 includes providing at least one first base member 110, which may be part of a plurality of extruded structural members of the expandable housing 100, 100', 100", 201. Forming a first rack unit 101 through a first set of extruded structural members 115, 120, 125, 130, 135, 145, which are part of a plurality of extruded structural members, as illustrated in block 202. The first set of extruded structural members are connected to each other through a plurality of first interconnecting contact joints. Thus, an interconnecting contact joint is provided between any extruded structural members of the plurality of extruded structural members for engagement. Adding additional rack units 102/103/104 (say, a second rack unit 102) on the first rack unit 101 through the second set of extruded structural members 121, 126, 131, 146 being part of the plurality of extruded structural members configured to engage with each other through a plurality of second interconnecting contact joints, as illustrated in block 203. Moreover, the second set of extruded structural members are connected to each other and also, with the first set of extruded structural member (first rack unit) through the plurality of second interconnecting contact joints 154 (shown in FIG. 9(b)). The plurality of second interconnecting contact joints are similar in construction to the plurality of first interconnecting contact joints explained in earlier examples, hence, repetition is avoided for brevity. Thus, the plurality of extruded structural members can be used to build additional rack units on the existing expandable housing.

The present subject matter is described with reference to the foregoing examples. Although specific examples have been illustrated and described herein, the scope of the subject matter as claimed is intended to cover any equivalents thereof. As other forms, details, and examples may be made without departing from the scope of the present subject matter.

We claim:

1. An expandable housing for a computing system, the expandable housing comprising: a first base member; and a plurality of extruded structural members each comprising: a first planar face, a second planar face opposite the first planar face, and edges connecting the first planar face to the second planar face, wherein the first base member and at least some of the extruded structural members comprises grooves, and the grooves of the extruded structural members are recessed in the first planar face or the second planar face; wherein at least some of the extruded structural members comprise protrusions, each of the protrusions protruding from one of the edges of one of the extruded structural members along a direction parallel to the first and second planar faces, each of the protrusions being configured to be received within, and having a complementary profile to, the associated grooves of the first base member and at least some of the extruded structural members; wherein the plurality of extruded structural members are configured to be assembled together and to the first base member via interconnecting contact joints to form a plurality of rack units stacked together upon the first base member, each of the interconnecting contact joints being formed by one of the protrusions being received within one of the grooves, wherein the plurality of rack units includes a first rack unit formed on top of the first base member and a second rack unit formed on top of the first rack unit, wherein the first rack unit is formed by a first set of the extruded structural members comprising: a first side wall directly coupled perpendicularly to the first base member via one of the interconnecting contact joints, a second side wall directly coupled perpendicularly to the first base member via one of the interconnecting contact joints, and a first top wall arranged parallel to and opposite from the first base member and directly coupled to the first and second side walls via two of the interconnecting contact joints; and wherein the second rack unit is formed by a second set of the extruded structural members comprising: a third side wall directly coupled perpendicularly to the first top wall via one of the interconnecting contact joints, a fourth side wall directly coupled perpendicularly to the first top wall via one of the interconnecting contact joints, and a second top wall arranged parallel to and opposite from the first top wall and directly coupled to the third and fourth side walls via two of the interconnecting contact joints.

2. The expandable housing for the computing system of claim 1,
wherein the first side wall is mounted to the first base member through a first-joint of the interconnecting contact joints, and the second side wall is mounted to the first base member through a second-joint of the interconnecting contact joints, and wherein the first side wall and the second side wall are mounted at lateral ends of the first base member; and
wherein the first base member extends from the first side wall to the second side wall forming a bottom wall of the first rack unit.

3. The expandable housing for the computing system of claim 2,
wherein the first set of extruded structural members includes a first rear wall mounted to the first side wall and the second side wall through a third-joint and a fourth joint, respectively, of the interconnecting contact joints.

4. The expandable housing for the computing system of claim 2,
wherein the first top wall is mounted to the first side wall and the second side wall through a fifth-joint and a sixth joint, respectively, of the interconnecting joints, and
wherein the first and second side walls each extend longitudinally in a first direction and comprises a front portion extending along the first direction and a rear portion extending along the first direction; and wherein the first top wall extends in the first direction along the respective front portions of the first side wall and the second side wall but not along the respective rear portions of the first side wall and the second side wall.

5. The expandable housing for the computing system of claim 2,
wherein the first joint comprises a first groove on the first base member and a first protrusion on the first side wall, and
wherein the second joint comprises a second groove on the first base member and a second protrusion on the second side wall.

6. The expandable housing for the computing system of claim 4,
wherein the first set of extruded structural members further comprise a plurality of first vertical walls, and
the plurality of first vertical walls is disposed between and connected with the first top wall and the first base member through seventh-joints and eighth-joints, respectively, of the interconnecting contact joints.

7. The expandable housing for the computing system of claim 1,
wherein the first set of extruded structural members include a plurality of first vertical walls coupled to and extending between the first base member and the first top wall, wherein each of the plurality of first vertical walls comprises a first profile portion for supporting a corresponding horizontal member of a plurality of first horizontal members to form a corresponding partition.

8. The expandable housing for the computing system of claim 1,
wherein, for each of the plurality of extruded structural members, a thickness between the first planar face and the second planar face, excluding the grooves, is substantially uniform;
wherein the plurality of extruded structural members are stackable in a disassembled condition such that, in a stacked state, each pair of the extruded structural members that are stacked one on the other will have planar surface contact therebetween.

9. The expandable housing for the computing system of claim 1,
wherein each of the grooves and the protrusions comprises a non-linear profile.

10. The expandable housing for the computing system of claim 1, wherein the interconnecting contact joints each, comprises a contact portion formed between the groove and protrusion of the interconnecting contact joint, wherein a true length of the contact portion is greater than a first width of at least one of the two extruded structural members connected together by the interconnecting contact joint.

11. The expandable housing for the computing system of claim 10, each of the interlocking contact joints comprises a positive joint forming the contact portion.

12. The expandable housing for the computing system of claim 11, wherein the grooves and the protrusions are engageable by a transition fit, and a fastener further secures the one extruded structural member with the other extruded structural member.

13. The expandable housing for the computing system of claim 11, wherein the contact portion comprises a true length being at least 1.5 times the first width.

14. A method of constructing an expandable housing for a computing system, the method comprising:
providing the expandable housing for a computing system of claim 1;
forming the first rack unit on the first base member, by engaging protrusions and recesses of the first set of extruded structural members and of the first base member; and
forming a second rack unit on the first rack unit by engaging protrusions and recesses of the first and second sets of the extruded structural members.

* * * * *